United States Patent [19]

Dijaili et al.

[11] Patent Number: 5,436,759
[45] Date of Patent: Jul. 25, 1995

[54] CROSS-TALK FREE, LOW-NOISE OPTICAL AMPLIFIER

[75] Inventors: Sol P. Dijaili, Moraga; Frank G. Patterson, Livermore; Robert J. Deri, Pleasanton, all of Calif.

[73] Assignee: The Regents of the University of California, Oakland, Calif.

[21] Appl. No.: 260,275

[22] Filed: Jun. 14, 1994

[51] Int. Cl.⁶ .............................................. H01S 3/18
[52] U.S. Cl. ...................................... 359/333; 359/337
[58] Field of Search ............... 359/333, 337, 344, 346, 359/340; 372/18, 19

[56] References Cited

U.S. PATENT DOCUMENTS

| | | | |
|---|---|---|---|
| 3,467,906 | 9/1969 | Cornely et al. | 330/127 |
| 3,500,231 | 3/1990 | Tomiyasu et al. | 359/333 |
| 4,364,014 | 12/1982 | Gray | 359/333 |
| 4,551,684 | 11/1985 | Bernhardt | 330/372 |
| 4,942,366 | 7/1990 | Toda | 359/333 |

(List continued on next page.)

FOREIGN PATENT DOCUMENTS

| | | |
|---|---|---|
| 0430911 | 5/1991 | European Pat. Off. . |
| 2246181 | 1/1990 | Japan ............... H01S 3/18 |

OTHER PUBLICATIONS

Eisentstein et al., Gain Recovery Time of Traveling-Wave Semiconductor Optical Amplifiers, Appl. Phys. Lett., 54 pp. 454–456 (1989).
Tiemeijer et al., Polarization Insensitive Multiple Quantum Well Laser Amplifiers for the 1300 nm Window, App. Phys. Lett. 62 pp. 826–828 (1993).
Koyama et al., Multiple-Quantum-Well GaInAs/-GaInAsP Tapered Broad-Area Amplifiers with Monolithically Integrated Waveguide Lens for High Power Applications, IEEE Photonics Tech. Lett., vol. 5, No. 8, pp. 916–919 (1993).
Olsson, Lightwave Systems with Optical Amplifiers, J. Lightwave Tech., vol. 7, No. 7, pp. 1071–1082 (1989).
Kogelnik et al., Considerations of Noise and Schemes for Its Reduction in Laser Amplifiers, Proc. IEEE, vol. 52, pp. 165–172 (1964).
Yamamoto et al., Controlled Spontaneous Emission in Microcavity Semiconductor Lasers, in *Coherence, Amplification, and Quantum Effectsin Semiconductor Lasers*, ed. Y. Yamamoto, chp. 13, John Wiley & Sons, 1991.

(List continued on next page.)

*Primary Examiner*—Mark Hellner
*Attorney, Agent, or Firm*—Henry P. Sartorio; John P. Wooldridge

[57] ABSTRACT

A low-noise optical amplifier solves crosstalk problems in optical amplifiers by using an optical cavity oriented off-axis (e.g. perpendicular) to the direction of a signal amplified by the gain medium of the optical amplifier. Several devices are used to suppress parasitic lasing of these types of structures. The parasitic lasing causes the gain of these structures to be practically unusable. The lasing cavity is operated above threshold and the gain of the laser is clamped to overcome the losses of the cavity. Any increase in pumping causes the lasing power to increase. The clamping action of the gain greatly reduces crosstalk due to gain saturation for the amplified signal beam. It also reduces other nonlinearities associated with the gain medium such as four-wave mixing induced crosstalk. This clamping action can occur for a bandwidth defined by the speed of the laser cavity. The lasing field also reduces the response time of the gain medium. By having the lasing field off-axis, no special coatings are needed. Other advantages are that the lasing field is easily separated from the amplified signal and the carrier grating fluctuations induced by four-wave mixing are decreased. Two related methods reduce the amplified spontaneous emission power without sacrificing the gain of the optical amplifier.

24 Claims, 6 Drawing Sheets

U.S. PATENT DOCUMENTS 5,091,916  2/1992  Cimini, Jr. et al. ............... 372/19 X
5,119,039  6/1992  Olshansky et al. .................. 359/346
5,184,247  2/1993  Schimpe .............................. 359/344
5,313,324  5/1994  Le et al. ............................. 359/344

OTHER PUBLICATIONS

DeMartini et al., Anomalous Spontaneous-Stimulated-Decay Phase Transition and Zero-Threshold Laser Action in a Microscopic Cavity, Phys. Rev. Lett., vol. 60, No. 17, pp. 1711–1714 (1988).

Kosonocky et al., GaAs Laser Amplifiers, IEEE J. Quantum Electronics, vol. QE4, No. 4, (1968).

Desurvire et al., Gain Saturation Effects in High-Speed, Multichannel Erbium-Doped Fiber Amplifiers at lamda=1.53 μm, J. Lightwave Tech., vol. 7, No. 12. pp. 2095–2104 (1989).

daSilva et al., Automatic Gain Flattening in Optical Fiber Amplifiers Via Clamping of Inhomogeneous Gain, IEEE Photonics Tech. Lett., vol. 4, No. 4, pp. 412–414 (1993).

Brierley et al. Progress on Optical Amplifiers for 1.3 μm, Tech. Digest. Optical Fiber Communications Conference, paper TuL3, p. 67 (1992).

Jopson et al. Measurement of Carrier–Density Mediated Intermodulation Distortion in an Optical Amplifier, Electronics, Lett., vol. 23, No. 25, pp. 1394–1395 (1987).

Koga et al., The Performance of a Traveling-Wave-Type Semiconductor Laser Amplifier as a Booster in Multiwavelength Simultaneous Amplification, J. Lightwave Tech., vol. 8, No. 1, pp. 105–112 (1990).

Saleh et al., Compensation of Nonlinearity in Semiconductor Optical Amplifiers, Electronics Lett., vol. 24, No. 15, pp. 950–952 (1988).

Saleh et al., Effects of Semiconductor-Optical-Amplifier Nonlinearity on the Performance of High-Speed Intensity-Modulation Lightwave Systems, IEEE Trans. on Communications, vol. 38, No. 6, pp. 839–846 (1990).

Nyairo et al., Multiple Channel Signal Generation Using Multichannel Grating Cavity Laser with Crosstalk Compensation, Electronics LEtt., vol. 28, No. 3, pp. 261–263 (1992).

CROSS-TALK FREE, LOW-NOISE OPTICAL AMPLIFIER

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to the amplification of optical light by stimulated emission, and more specifically, to the reduction of signal crosstalk and amplified spontaneous emission to create a low-noise optical amplifier.

2. Description of Related Art

In a general sense, crosstalk and amplified spontaneous emission (ASE) are the two sources of noise in an optical amplifier. ASE originates from the (spontaneous) emission of incoherent light over the (broad) gain bandwidth of the amplifier. This is the random noise contribution of the optical amplifier. Crosstalk can be categorized as noise by a deterministic signal and arises whenever more than one data channel interacts in an optical amplifier. Crosstalk most commonly originates from data-dependent gain fluctuations at high output powers from the Optical amplifier. This can occur for data multiplexed in either the wavelength or the time domain. In the wavelength domain, gain saturation induced by a data channel operating at wavelength $\lambda_1$ produces a level change in another data channel at wavelength $\lambda_2$. In the time domain, gain saturation induced by a data channel occupying time slot $t_1$ produces a level change for data transmitted at a later time $t_2$ if an individual bit saturates the gain and the temporal separation ($t_2-t_1$) is shorter than the gain recovery time for the optical amplifier.

In optical amplifiers, the above-described noise sources present two limitations on the amplifier operating range. At low input signal levels the amplifier random noise contribution, ASE, causes bit errors (signal-spontaneous beat noise) while at large input signal levels, nonlinearities in the gain medium lead to crosstalk between data channels as described above. Much work has been devoted to extending the useful operating range of optical amplifiers. The two most commercially viable optical amplifiers for optical communications applications are erbium doped fiber amplifiers (EDFA) and semiconductor optical amplifiers (SOA). The gain medium in the EDFA has a comparatively long excited-state lifetime or relaxation time (0.1–1 ms). This allows for a larger saturation energy and hence, for high speed data pulses (~1 ns), the gain medium is virtually not saturated [Desurvire et al "Gain Saturation Effects in High-Speed, Multichannel Erbium-Doped Fiber Amplifiers at lambda=1.5 $\mu$m", J. Lightwave Tech., vol. 7, no. 12, pp. 2095–2104 (1989)]. Time domain crosstalk is not an issue for high speed data in EDFA's. An automatic gain control (AGC) circuit at the detection end can compensate for fluctuations in the data stream that occur on the order of 1 ms. However, significant crosstalk between channels can occur for multichannel applications such as wavelength division multiplexing (WDM), especially when one channel is dropped or added to the system. AGC can be used, but only if the wavelength filter used for demultiplexing is further constrained. An inline and counterpropagating lasing field with an EDFA cooled to 77° K. has been used to inhomogeneously broaden and thereby spectrally separate and equalize the gain curve [da Silva et al "Automatic Gain Flattening in Optical Fiber Amplifiers Via Clamping of Inhomogeneous Gain", IEEE Photonics Tech. Lett., vol. 5, no. 4, pp. 412–414 (1993)]. However, this device has limited usefulness since a refrigeration mechanism is required, it is intrinsically unidirectional in amplification of the signal beam, and the crosstalk is suppressed only for wavelength channel spacings greater than the inhomogenous linedwidth. In order to reduce the system complexity, a more elegant solution to the EDFA (WDM) crosstalk problem is needed.

U.S. Pat. No. 3,467,906 discloses a transverse lasing field used to obtain a gain medium that is independent of pumping current. This patent claims to suppress the ASE along the amplification path. This invention does not suppress the parasitic lasing modes in the highly multimode lasing structure. The parasitic lasing modes often take the form of low loss circulating modes and prematurely clamp the gain at a level that is too low to be useful. These circulating modes often arise from totally internally reflected paths within the structure. In addition, these inventors did not take into account carrier-carrier scattering in stating that the noise output along the length of the amplifier is suppressed by the, transverse lasing field. The amplifier noise in this structure is suppressed only with a commensurate suppression of gain at that wavelength. In other words, the stated structure will not improve the output signal-to-noise ratio over a conventional optical amplifier.

Crosstalk is considered to be the most difficult problem to solve in SOAs. Some researchers have identified crosstalk as the problem preventing widespread use of SOA's [Brierly et al "Progress on Optical Amplifiers for 1.3 $\mu$m", Tech. Digest. Optical Fiber Communications Conference, paper TuL3, p. 67 (1992)]. Crosstalk severly limits the operation of SOAs for both high speed data and multichannel applications such as WDM [Jopson et al "Measurement of Carrier-Density Mediated Intermodulation Distortion in an Optical Amplifier", Electronics Lett., vol. 23, no. 25, pp. 1394–1395 (1987), Koga et al "The Performance of Traveling-Wave-Type Semiconductor Laser Amplifier as a Booster in Multiwavelength Simultaneous Amplification", J. Lightwave Tech., vol. 8, no. 1, pp. 105–112 (1990), Saleh et al "Effects of Semiconductor-Optical-Amplifier Nonlinearity on the Performance of High-Speed Intensity-Modulation Lightwave Systems", IEEE Trans. on Communications, vol. 38, no. 6, pp. 839–846 (1990)].

All these crosstalk mechanisms originate from data-dependent gain fluctuations at higher output powers from the SOA. The carrier lifetime is comparatively short in the most common semiconductors used for laser diodes and optical amplifiers (~1 ns). This time constant is presently not attainable with AGC circuits. Thus, data that has fluctuations on the order of a 1 Gb/s and output powers levels on the order of the saturation power have severly degraded detection fidelity [Saleh et al "Effects of Semiconductor-Optical-Amplifier Nonlinearity on the Performance of High-Speed Intensity-Modulation Lightwave Systems", IEEE Trans. on Communications, vol. 38, no. 6, pp. 839–846 (1990)]. For example, a typical double heterostructure amplifier has an output saturation power of 3 dBm and a gain of approximately 25 dB. The input power must be less than −22 dBm in order to avoid signal crosstalk in the time domain (intersymbol interference). Similar constraints apply to WDM crosstalk. Researchers have tried to solve the crosstalk problem using feedforward methods [Saleh et al "Compensation of Nonlinearity in Semiconductor Optical Amplifiers", Electronics Lett., vol. 24, no. 15, pp. 950–952 (1988), Nyairo et al "Multiple Channel Signal Generation Using Multichannel Grating Cavity Laser with Crosstalk Compensation", Electronics Letto, vol. 28, no. 3, pp. 261–263 (1992)]; however, these schemes are limited in operating range, and do not solve the general problem of crosstalk for multichannel applications.

Other researchers have tried to solve the problem in the time domain by decreasing the carrier lifetime [Eisenstein et al "Gain Recovery Time of Traveling-Wave Semiconductor Amplifiers", Appl. Phys. Lett., 54 pp. 454–456 (1989)]. This type of solution does not improve crosstalk performance for wavelength multichannel applications. Another direct approach is to increase the output saturation power of the amplifier by using quantum wells as the gain medium. As described in [Tiemeijer et al "Polarization insensitive multiple quantum well laser amplifiers for the 1300 nm window", Appl. Phys. Lett., 62 pp. 826–828 (1993)], a high saturation power, polarization independent, low coupling loss device has been developed using low confinement factor quantum well devices to increase the saturation power. Even though the saturation power is increased by approximately 10 dB, the crosstalk problem is still present and only shifted up in power by 10 dB.

Another approach to increase the output saturation power is to use a tapered amplifier design [Koyama et al "Multiple-Quantum-Well GainAs/GainAsP Tapered Broad-Area Amplifiers with Monolithically Integrated Waveguide Lens for High Power Applications", IEEE Photonics Tech. Lett., vol. 5, no. 8,. pp. 916–919 (1993)]. This particular design requires almost an order of magnitude more pump current than required by conventional SOAs. One could think of increasing the carrier lifetime to the order of a microsecond in a n-i-p-i structure thus approaching the crosstalk situation of an EDFA; however, the gain length would be increased by several orders of magnitude which is unreasonable for a semiconductor device. For optical amplifiers in general, a device inherent solution to the crosstalk problem is needed. One researcher has used an on-axis lasing field to speed the modulation response of an SOA [U.S. Pat. No. 5,119,039] but no mention of crosstalk reduction was made in either the time or spectral domains.

U.S. Pat. No. 5,184,247 discloses a spectral filter for use in a waveguide structure with gain in order to stabilize the gain medium by lasing the structure at the passband wavelength of the spectral filter. This invention does not allow for practical separation of the resulting laser light from the amplified signal. A separate filter must be used to suppress the laser light in the direction of the amplified signal. In a specific embodiment where a transverse lasing field was employed in conjunction with a perpendicular waveguide, the inventor includes a saturable absorber section which only allows it to be used as a nonlinear wavelength conversion device or pulse regenerator, as the inventor points out. This particular embodiment does not mention a method of suppressing the circulating and/or other pararsitic lasing modes of this structure. Futhermore, no method for suppressing the ASE in this type of optical amplifier is presented.

An improvement in the signal to random noise ratio for an optical amplifier is useful only if the ASE power can be decreased without sacrificing the signal gain. The traditional method is to use spectral filtering since the spectrum of the ASE is much broader than that of the signal [Olsson "Lightwave Systems with Optical Amplifiers", J. Lightwave Tech., vol. 7, no. 7, pp. 1071–1082 (1989)]. The filter bandwidth cannot be arbitrarily narrowed, however, because systems requirements will not tolerate the need to accurately match and stabilize the source wavelength and central wavelength of the filter. Thus, even after spectral filtering the signal-spontaneous beat noise dominates. An alternative method for decreasing the ASF power without sacrificing signal power is desirable. Some researchers have used an aperture to spatially filter the ASE [Kogelnik et al "Considerations of Noise and Schemes for Its Reduction in Laser Amplifiers", Proc. IEEE, vol. 52, pp. 165–172 (1964); EP 0430911 A1; U.S. Pat. No. 4,551,684] in optical amplifiers, but the exponential gain of the ASE is not altered. One researcher has patented an off-axis laser cavity to decrease ASE noise [JP 2246181 A]; however, the effectiveness of this invention is not realized since it reduces ASE emission in the amplified direction at the expense of decreasing the gain overlap and hence; the gain of the amplified signal. This solution does not improve the output signal-to-noise ratio of the optical amplifier as implied.

SUMMARY OF THE INVENTION

It is an object of the present invention to use a segmented transverse lasing field to reduce crosstalk in optical amplifiers in wavelength divison multiplexed systems.

it is another object of the invention to reduce time domain crosstalk and intersymbol interference using the same structure as for the wavelength domain crosstalk reduction.

It is another object of the invention to reduce the ASE in the optical amplifier using microcavities without a commensurate decrease in signal gain.

Another object of the invention is to reduce noise in a series of semiconductor optical amplifiers by using distributed spatial filter arrangement of amplifier sections.

Still another object of the invention is to provide high-speed amplitude modulation with a good extinction ratio.

A further object of this invention is to improve the performance (in terms of output signal-to-noise ratio and effective output saturation power) of semiconductor optical amplifiers, Erbium doped fiber amplifiers, rare-earth doped waveguide optical amplifiers, and amplifiers using other gain materials such as Ti-Sapphire, NdYag, porous silicon, or any other material possessing gain by stimulated emission.

Another object of this invention is to enable a number of applications, for example: the application of this technology in the use of multichannel wavelength sources and receivers that use optical amplifiers within and outside their cavities; the use of this type of amplifier in a switch matrix; in modelocked lasers; in low noise high sensitivity applications including free-space applications; and the use of this technology in low noise laser sources.

Another object of the invention is to reduce the sensivity of the optical amplifier performance to factors such as temperature, aging, stress, power supply fluctuations, etc.

This invention solves crosstalk problems in optical amplifiers by using a segmented optical cavity oriented off-axis (e.g. perpendicular) to the direction of a signal amplified by the gain medium of the optical amplifier. A major practical problem to solve in this type of structure is the parasitic lasing modes which are often composed of low loss totally internally reflecting modes. These modes clamp the gain at low levels and disrupt the usefulness of the device. By proper segmentation and design techniques, the parasitic lasing modes can be suppressed. The lasing cavity is operated above threshold. The gain of the laser is clamped to overcome the losses of the cavity. Any increase in pumping causes the lasing power to increase. The clamping action of the gain greatly reduces crosstalk due to gain saturation. This property of eliminating the effects of gain saturation can be thought of as effectively increasing the output saturation power of the optical amplifier. It also reduces other nonlinearities associated with the gain medium such as four-wave mixing induced crosstalk. This clamping action can occur for a bandwidth defined by the speed of the laser cavity.

The propagation direction of the lasing field is off-axis relative to the propagation direction of the signal being amplified. By combining a lasing field that spans an appreciable length of the amplifier with a guided wave amplifier section, a problem with parasitic lasing modes that usually take the form of circulating lasing modes naturally arises. Segementing the lasing cavity along the length of the amplifier with regions that are optically isolated can suppress these modes. The circulating modes tend to be totally internally reflecting and thus often have significantly lower loss. This lower loss prematurely clamps the gain in this type of device and a low gain results for the amplified signal. By appropriately designing the structure, these circulating modes can be used advantageously. Disclosed herein are several designs that solve the practical problem of parasitic lasing modes associated with this type of device. The solution of this problem is of fundamental importance that enables this device to be practically implemented with modern high gain materials as well as to achieve a high overall gain. A lasing field (created by a laser that shares the gain medium with the amplifier gain medium) of proper design can be used with the homogeneous gain medium. By having the lasing field off-axis and the gain medium homogenously broadened, no special coatings beyond the normal antireflection coatings are needed on the amplifier facets. The lasing field also reduces the response time of the gain medium. Other advantages of our technique are that the lasing field is easily separated from the amplified signal and the carrier grating fluctuations induced by four-wave mixing are decreased.

If the laser light is injected into the amplifier cavity, the amplifier can be used as a high speed modulator. Since the gain is no longer clamped by the lasing action, the gain can now be modulated by varying the current to the amplifier. A major practical problem to solve is the means by which the injected light is introduced and kept separate from the amplified light. By making a small modification to the off-axis tranverse lasing cavity, the injected light is easily separated and the amplified beam can access the full spectral width of the gain medium and have polarization independent gain as well. If the mirror is moved outside the cavity, then the gain is no longer clamped by the lasing field. The gain of the medium can now be modulated by several means. The lasing field can enhance the amplitude modulation speed of the amplifier due to stimulated emission. This is in contrast to U.S. Pat. No. 5,119,039, where the gain is clamped by the lasing field and modulation is claimed to be possible by phase modulation.

The dominant source of random noise in an optical amplifier is the spontaneous emission power at the output of the optical amplifier. The noise reduction in the present invention is accomplished by using two methods to reduce this output spontaneous emission power without simultaneously sacrificing signal gain. The first method takes advantage of the differences in spatial emission characteristics of the spontaneous emission versus stimulated emission (i.e. amplification of the signal beam). The technique uses the fact that spontaneous emission radiates into $4\pi$ steradians and the signal beam radiates into a much moire restricted angle. This distinction is exploited by using a diffraction region between guided wave gain regions. This filtering effect happens in a differential and distributed manner allowing the gain of the amplified spontaneous emission to be dramatically less than the gain of the signal. Thus the output ASE power of the optical amplifier can be substantially decreased. The second method is to employ a microcavity as the transverse cavity. Such a cavity will decrease the ASE power along the amplified signal direction. This second noise reduction technique does not decrease the gain of the ASE. Thus, the two noise reduction techniques in conjunction can dramatically decrease the output ASE from an optical amplifier.

DETAILED DESCRIPTION OF THE INVENTION

Figure 1A:
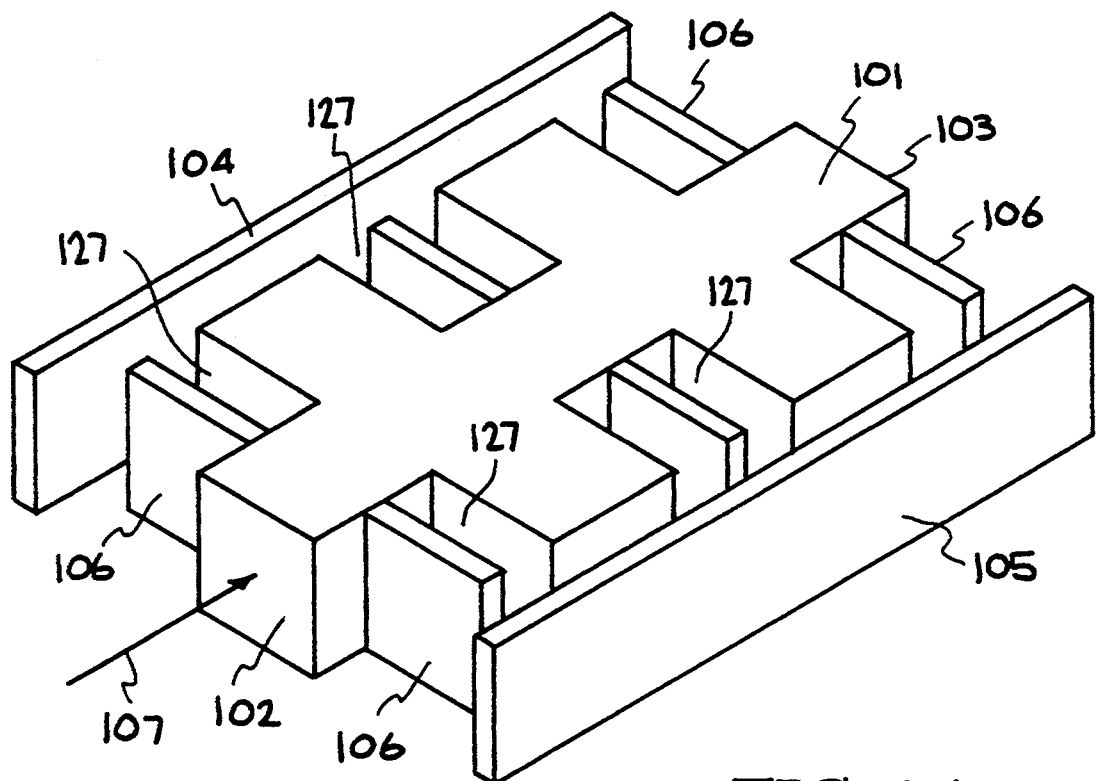
FIG. 1A shows a segmented transverse lasing optical amplifier.
Figure 1B:
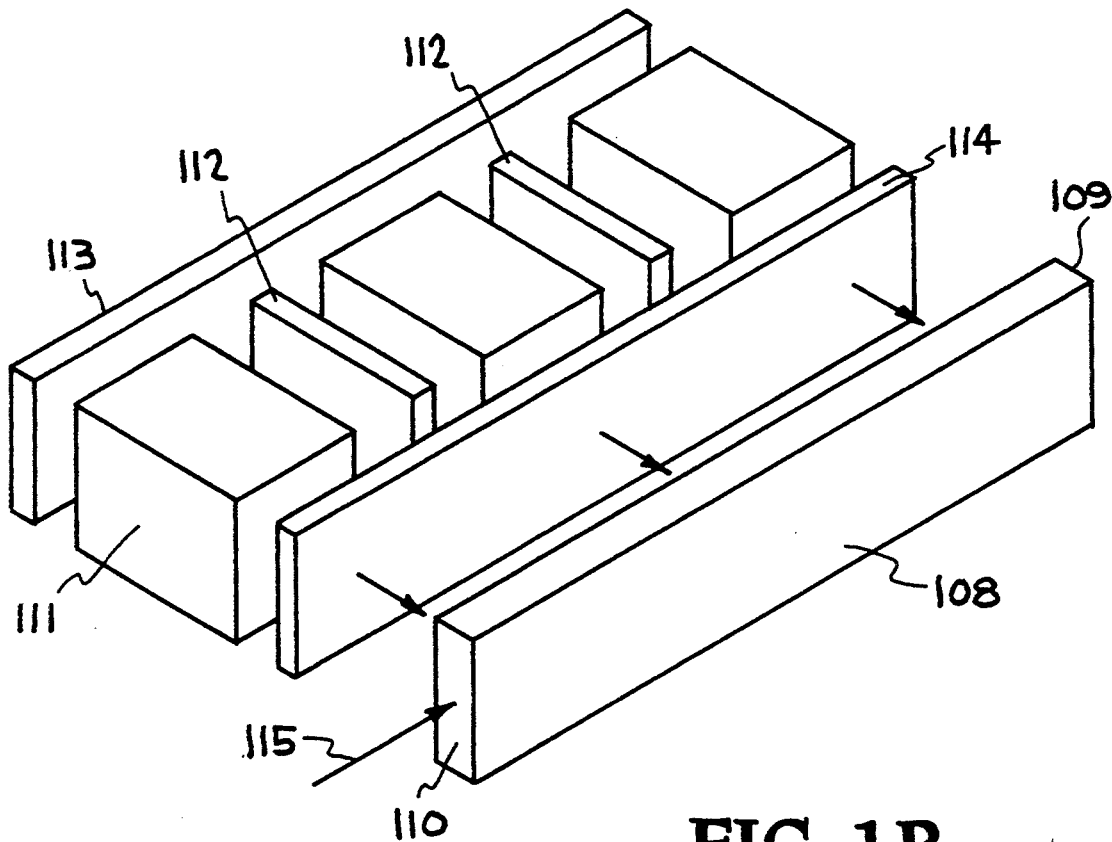
FIG. 1B shows a transverse plenum-injected amplifying gain medium.

The most general device configurations are shown in FIG. 1A and FIG. 1B. The basic parts of the invention include a homogeneously broadened or nonhomogeneously broadened gain medium which amplifies light (isotropically or nonistropically) and laser mirrors placed near the region of the gain medium with optically opaque regions dispersed along the amplifying path, as shown, for the purposes of segmenting the lasing regions and thus suppressing unwanted circulating modes and other parasitic lasing modes. FIG. 1A consists of gain medium 101, with facets 102 and 103 for coupling the signal to be amplified, and laser mirrors 104 and 105 for establishing a lasing field that shares the same gain medium as the amplified signal. The optically opaque sections 106 are placed within indented sections 127, and serve to block any parasitic lasing modes along the length of the device. The propagation direction of the amplified signal beam is shown by 107. An inhomogeneously broadened gain medium can be used in this process with power broadening of the homogeneous linewidth. Power broadening causes the homogeneous linewidth to exceed the inhomogeneous linewidth in an inhomogeneous gain medium. The guiding of the amplified signal can be configured in many ways. For example, index guided, gain guided, tapered designs, gratings, evanescent wave couplers, optical fibers, and rare-earth doped waveguide media can be used. The gain n-tedium can take many forms, e.g., semiconductor p-n junction, Ti-Sapphire, rare-earth element doped gain media (erbium, neodymium, praseodymium, thulium, etc) or any other future material such as porous Si. The gain medium can be pumped by any means to give stimulated emission, e.g., electrically, optically, chemically, etc. The mirrors also can encompass any that will cause lasing between them, e.g., dielectric, semiconductor interfaces, metal, distributed Bragg reflectors (DBR), etc. The mirrors can form a laser cavity at any angle with respect to the signal beam. There are advantages to the laser field existing in a different propagation direction than the signal beam. The mirrors can also form a separate laser outside the amplifying gain medium (FIG. 1B). This configuration is used for high speed amplitude modulation of the signal beam. The basic parts are the amplifying medium for the signal beam 108, with facets 109 and 110, the laser gain medium 111, the opaque blocking sections 112, and laser mirrors 113 and 114. Again the gain medium, mirrors, and angled facets can be of any type.

Referring to FIG. 1A, the gain medium is pumped as described above, and a lasing field is established by parts 101, 104, and 105. The opaque blocking sections posses enough optical loss to prevent parasitic lasing along the length of the device. This parasitic lasing can take the form of total internally reflected modes or otherwise. Thus, the lasing path is confined to the sections between mirrors 104 and 105 in a direction that is generally perpendicular to the direction of the amplified signal.

Since the roundtrip gain of the lasing sections are unity, this forces the single pass gain of the medium to be pinned to $\alpha - \ln\sqrt{r1r2}/L$ where $\alpha$ is the material and/or waveguide loss and r1 and r2 are the laser mirror reflectivities of mirrors 104 and 105, respectively. L is the distance between mirrors 104 and 105. As pumping is increased the excess carriers are converted to laser light within the cavity. The gain of the system is now pinned or clamped to passive losses $\alpha$, $r_1$ and $r_2$. Assuming an isotropic gain medium, the amplified signal can achieve a gain that is significantly higher than dictated by $\alpha$, $r_1$ and $r_2$ by elongating the gain medium in the amplified signal direction, lengthening the distance between the opaque sections and adding more sections as well. The distance between opaque sections is carefully chosen so as not to introduce the possiblity of parasitic lasing modes that prematurely clamp the gain. The process of clamping the gain now linearizes the response of the amplifier. Thus, the laser gain does not change due to signal input level changes. Hence the problems of both crosstalk in the time and frequency domains is solved. The action of the tranverse lasing field reduces any spatial grating effects in the gain medium due to other nonlinearities such as four-wave mixing since the carrier density is spatially pinned. There are two basic guidelines that keep the lasing field intact. The first is that the signal output power should not exceed the laser output power. The second guideline is that the data fluctuations on the signal beam are kept below the response speed of the lasing field. The type of optical amplifier where the gain is pinned by the lasing field is hereinafter referred to as a "ballasting optical amplifier" since the lasing field acts as a ballast.

Referring now to FIG. 1B, both gain media are optically pumped as described above with the provision that the signal amplifying gain medium is modulated by its pump source. The laser cavity formed by parts 111, 112, 113, and 114 is now outside the signal amplifying gain medium, 108. The purpose of this geometry is to allow the injected field to reduce the response time of the amplifying gain medium while allowing for the amplifying gain medium to be amplitude modulated by its pumping means, i.e. the injection current or otherwise. In this case the amplifying gain is not pinned since the lasing field is established outside the amplifying gain medium. With this geometry, the gain can be amplitude modulated. There can also be a much higher photon level injected into the device since the field causing the system to be stimulated emission dominated is side injected and not injected through the smaller area facet along the signal amplifying axis 115. This type of injected optical amplifier is hereinafter referred to as a "plenum-injection optical amplifier."

Figure 2A:
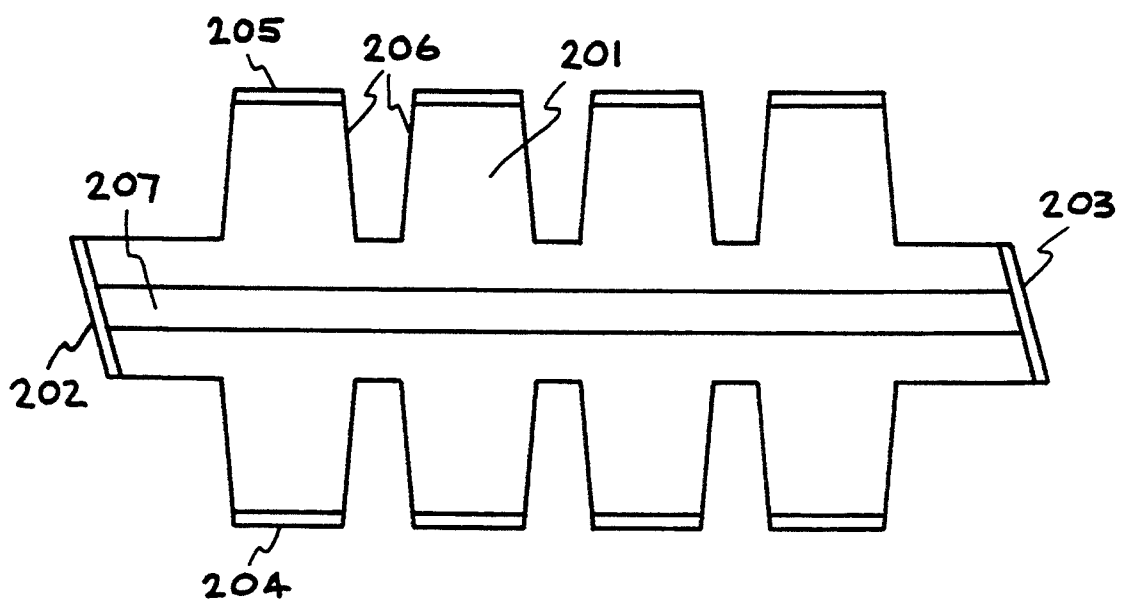
FIG. 2A–D shows several other embodiments to attain an off-axis lasing path without lasing from parasitic modes so that high gain is achieved in the optical amplifier.

Shown in FIG. 2A-D are the structures that provide an off-axis lasing path but suppress the unwanted parasitic lasing paths that are generally totally internally reflecting and along the path of the amplified signal beam. For the purposes of illustration, these structures are described on a slab type geometry in the plane of the page and a top view of the structure is as shown in the figure. These surfaces with minor modification can be surfaces of revolution to generate a 3 dimensional structure for bulk optical amplifier applications. In FIG. 2A, gain medium 201 comprises a waveguide 201 and further comprises indented sections 206 that are angled to reflect light out of the slab. Input and output facets 202, 203 are angled and antireflection coated. Laser mirrors 204, 205 are located on the outer portions of indented sections 206, and provide an off-axis lasing path. Indented sections 206 prevent the parasitic lasing paths from coupling between laser regions. The amplified signal is guided by the waveguide 207. For bulk type applications this waveguide can be removed. By pumping the gain medium above threshold for the lasing path between mirrors 204 and 205, the gain for the amplified signal along the waveguide 207 can be high (i.e. not clamped to a low level by low loss parasitic lasing modes) and free from crosstalk due to gain saturation and four-wave mixing.

Figure 2B:
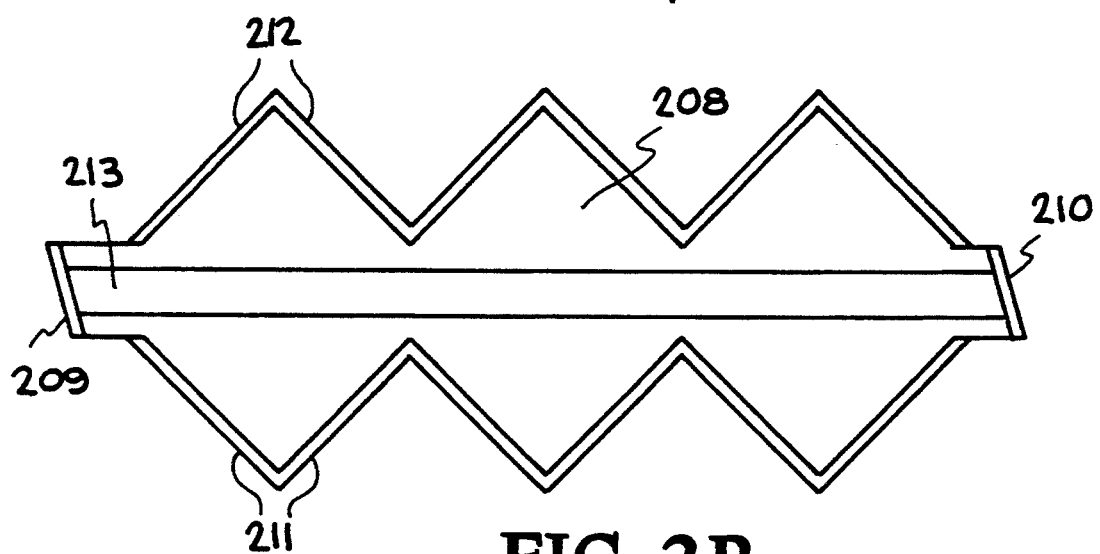

FIG. 2B shows another configuration where total internal reflection is used advantageously. The corner reflectors 211 and 212 establish multiple ring-shaped lasing paths between them, but present sufficient loss to parasitic paths. The gain medium 208 is energized above threshold for these ring-shaped lasing paths and thus the amplified signal propagating in waveguide 213 achieves high, crosstalk-free gain. The input and output coupling facets are 209 and 210 which are angled and antireflection coated.

Figure 2C:
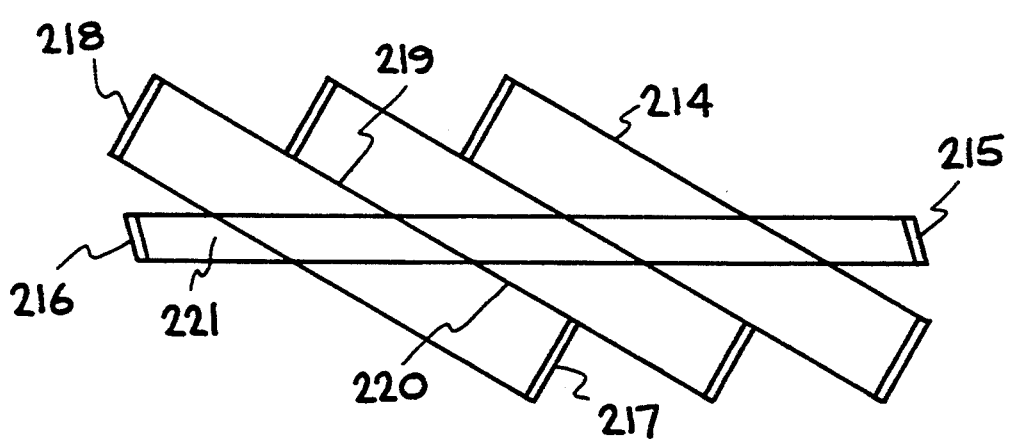

FIG. 2C shows another configuration where lasing cavities are angled and staggered so that most of the parasitic paths are deflected in the surrounding region away from the adjacent cavities. The lasing cavities are formed between mirrors 217 and 218 with gain medium 214. The input and output coupling facets 215 and 216 are antireflection coated and angled with respect to the waveguide 221. Angled trenches 219 and 220 deflect light out of the plane. These surfaces present sufficient loss to a particular parasitic mode in this type of structure.

Figure 2D:
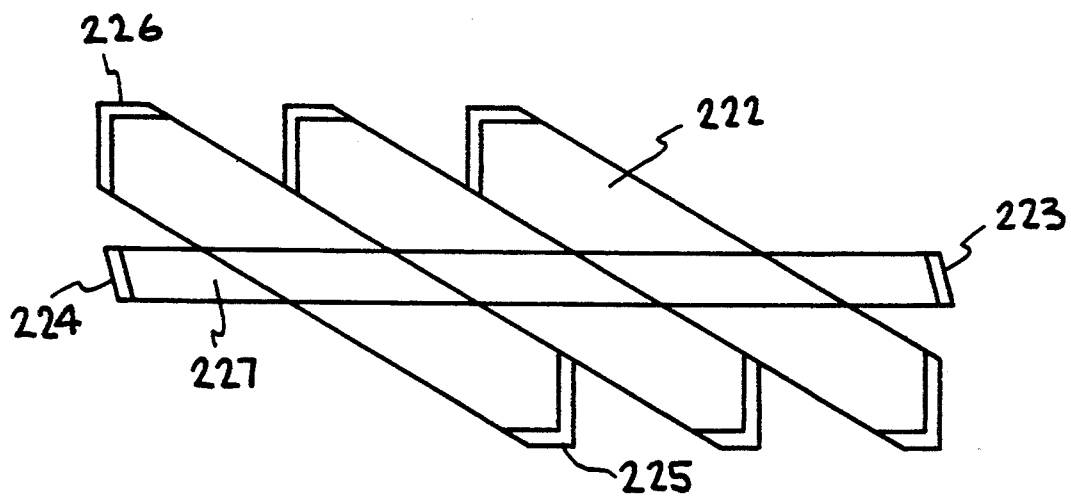

FIG. 2D shows another configuration where the lasing cavities are angled and staggered to suppress parasitic paths. Total internal reflection is used to form multiple ring-shaped lasing paths between mirrors 225 and 226. The input and output coupling facets 223 and 224 are antireflection coated and angled with respect to the waveguide 227. The gain medium 222 is energized above threshold for these ring-shaped lasing paths and thus the amplified signal propagating in waveguide 227 achieves high, crosstalk-free gain.

Figure 3:
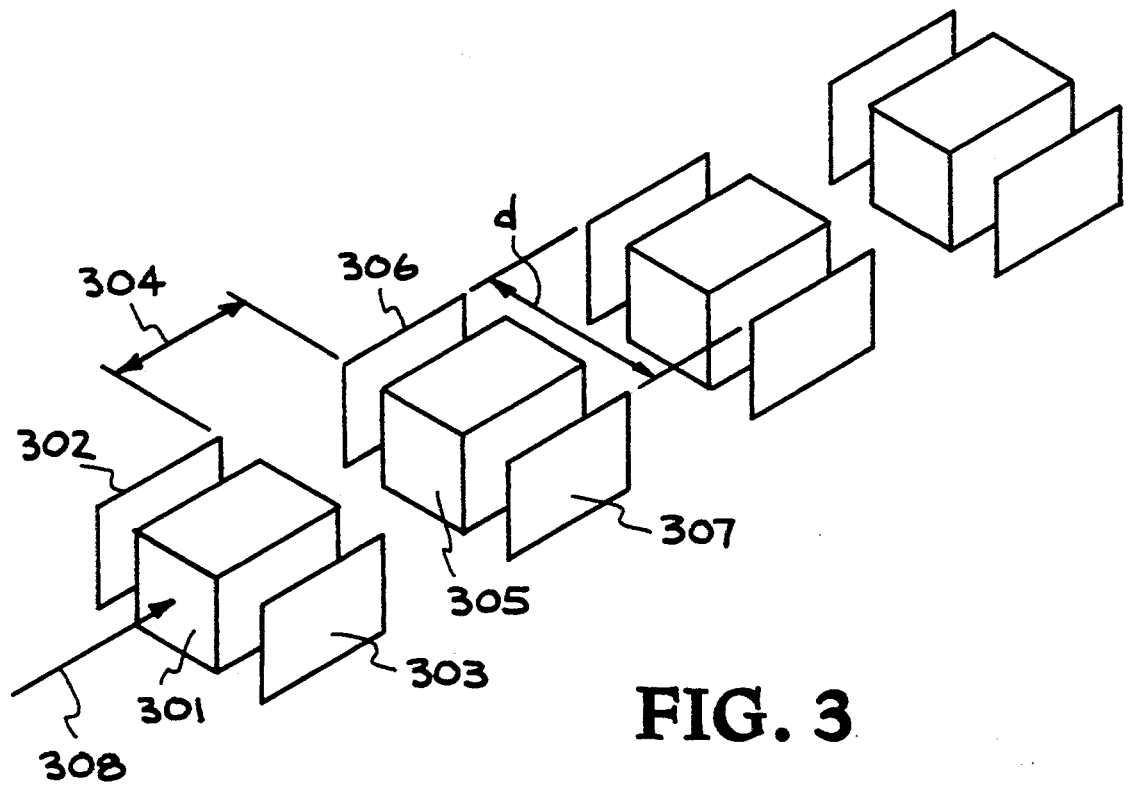
FIG. 3 shows a series of optical amplifier sections comprising a distributed periodic spatial filter and microcavity arrangements.

The primary parameter for improved noise performance is the output signal-to-noise ratio. For this to be as high as possible, the output saturation power of the amplified signal, $P_{sat}$, should be as high as possible and the output ASE should be as low as possible. The ballasting optical amplifier effectively increases $P_{sat}$ up to the power of the internal lasing power of the device. The ASE can be lowered by two methods. Referring to FIG. 3, if the distance between the lasing mirrors, d, is less than the coherence time multiplied by the speed of light in the medium, then a microcavity is formed. The spatial emission properties are significantly changed. According to Yamamoto [Yamamoto et al "Controlled Spontaneous Emission in Microcavity Semiconductor Lasers", in Coherence, Amplification, and Quantum Effects in Semiconductor Lasers, ed. Y. Yamamoto, chp. 13, John Wiley & Sons, 1991] and De Martini [De Martini et al "Anamolous Spontaneous-Stimulated-Decay Phase Transition and Zero-Threshold Laser Action in a Microscopic Cavity", Phys. Rev. Lett., vol. 60, no. 17, pp. 1711–1714 (1988).], the ASE can be significantly enhanced in the direction of the laser defined by mirrors 302 and 303, 306 and 307, etc. It also turns out that, according to Yamamoto, the lifetime of the ASE is increased. The inverse of the lifetime is proportional to the total spontaneous emission rate. Therefore, if the ASE is enhanced in a particular direction and the total rate decreases, then in the perpendicular direction, the ASE will decrease. Along the amplifying direction 308, the ASE power is then decreased. This noise reduction technique for optical amplifiers is hereinafter referred to as the "microcavity noise reduction" (MNR) method for optical amplifiers.

Figure 4:
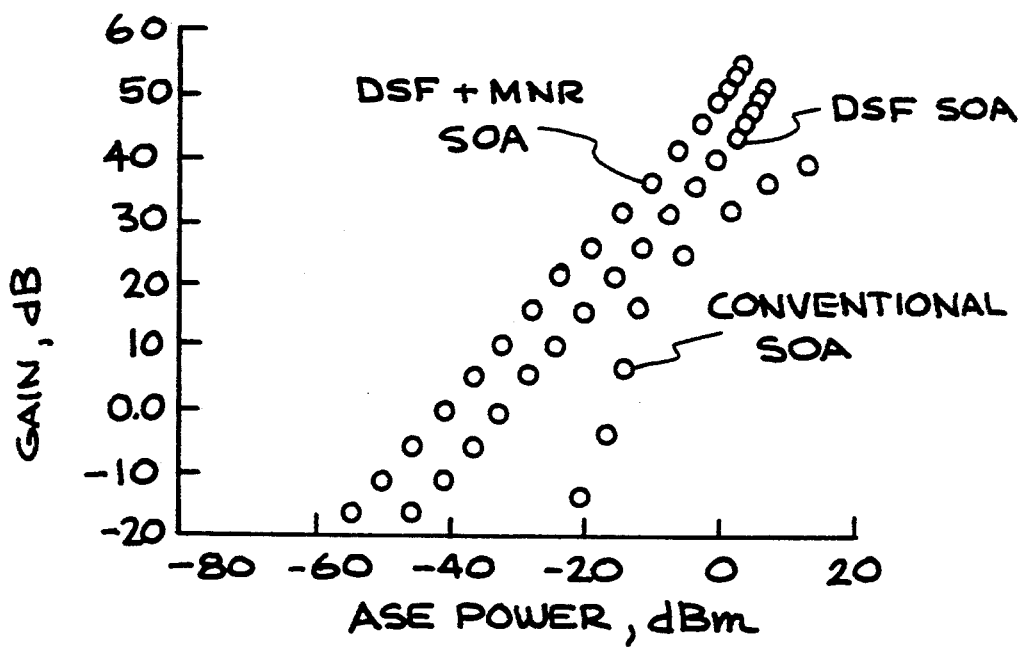
FIG. 4 is a plot of gain versus output amplified stimulated emission for a distributed spatial filter.

The second technique for reducing the output ASE power is to use a distributed spatial filter (DSF) also illustrated in FIG. 3. The basic layout includes guided wave regions with gain (comprising parts 301,305, etc.) separated by free space diffraction regions (304, etc.). The spatial frequency content of the ASE is essentially 4 $\pi$. On the other hand, the signal beam has a much reduced spatial frequency content basically dictated by the waveguide. The gain medium and hence the ASE emission sources are within the waveguide region. The diffraction region allows the beams with higher spatial frequency content to expand spatially. At the next guided wave region, the overlap is greater for the beam with a lower spatial frequency content, i.e. the signal beam. The difference is throughput for the ASE versus the signal beam for this process is about 1% since the ASE is partially guided. However, if this is performed in a periodic and differential manner, then a large difference in gain can be achieved between the ASE and the signal beam. The distance of each gain region should be short enough relative to the total length of the gain regions (hence the descriptor distributed spatial filter) such that exponential gain differences are realized between the ASE and the signal. To clarify the distinction with the distributed spatial filter (DSF) and conventional optical amplifiers, the standard equation for noise power is given by $P_{ase} = h\nu(\Delta\nu)(G-1)N_{sp}$. The terms h $\nu$, $\Delta\nu$, and $N_{sp}$ represents the energy of a single photon, the bandwidth of the ASE emission, and the ratio of the carrier density to the carrier density above transparency ($N_{sp}\sim 2$), respectively. For a conventional amplifier, G is signal gain given by $G = \exp(gL)$. With the DSF, G can be replaced with $G_{ase}$ where $G_{ase} << G$. This is in contrast to conventional wisdom which does not question the relationship $G = G_{ase} = G_{sig}$. Using the beam propagation method (BPM), the ASE power and signal power were modeled, including gain saturation for a conventional SOA. This model was used to predict the ASE power in a conventional SOA, enabling modifications for the DSF structure. Use of this model shows that the DSF can reduce ASE power by about 10 db. If the QED effect is experimentally verified and combined with the DSF, a 60 db SOA is possible since the gain is not saturated by the ASE. FIG. 4 illustrates these concepts. It should be noted again that these noise reduction concepts can be applied to any optical amplifier system.

Figure 5:
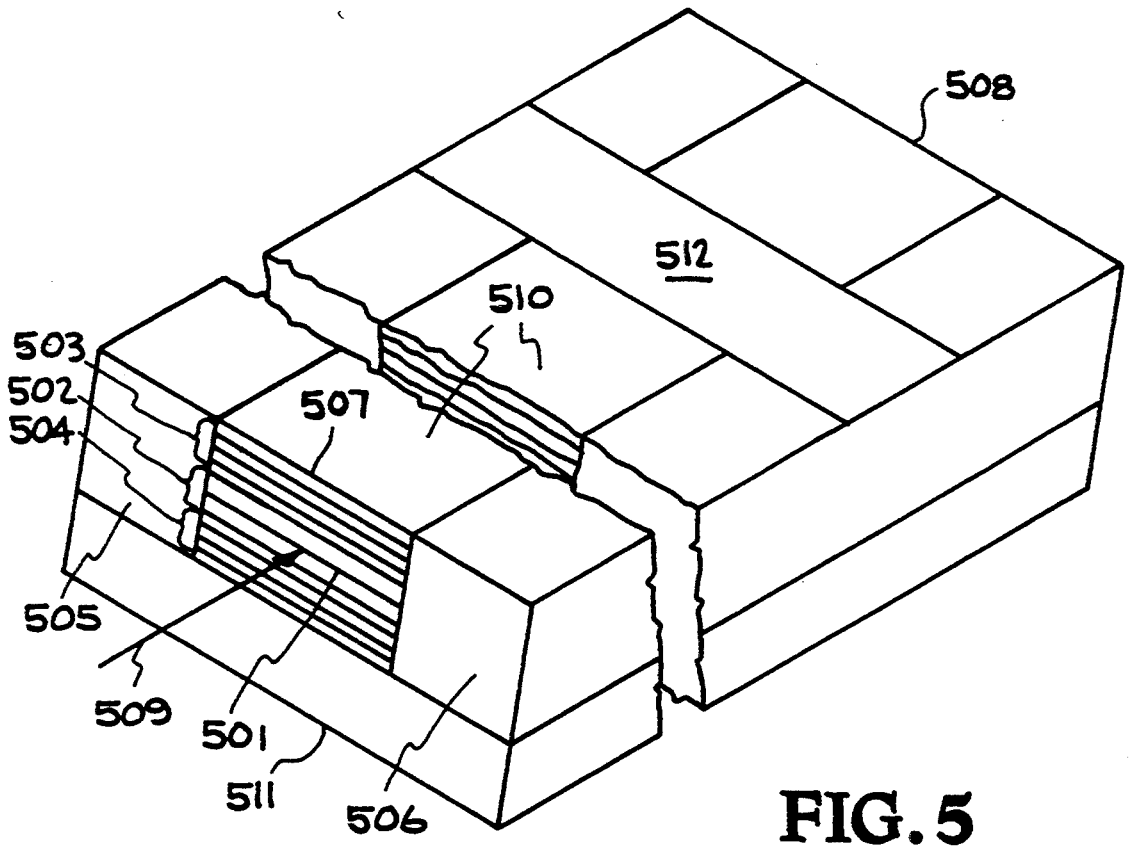
FIG. 5 shows a surface emitting ballasting semiconductor optical amplifier.

FIG. 5 shows a ballasting optical amplifier type semiconductor optical amplifier (SOA), referred to as a "surface emitting" type ballasting SOA. The vertical cavity surface emitting laser technology is well established at 0.9/$\mu$m wavelengths. The embodiment described below modifies a vertical cavity surface emitting laser for the purposes of crosstalk-free and low noise optical amplification. The structure is specially designed to suppress the parasitic lasing modes. The ballasting SOA consists of a gain medium (e.g. multiquantum well) 501, a graded index slab guide region 502, distributed Bragg reflectors 503 and 504 that are electrically conductive, passivating and electrically insulated cladding regions 505,506 of lower index, input and output angled facets 507 and 508 that are antireflection coated and windowed (a regrowth of cladding is used right before the air-interface), and an input signal axis 509. In order to suppress the parasitic lasing modes for this structure, the distributed Bragg reflectors are specially tailored to have a strong decrease in reflectivity off the vertical axis. This effect coupled with the diffraction region 512 serves the segmenting function needed to suppress the parasitic lasing modes. The lasing field is established by reflectors 503, 504, and gain medium 501. The pump current is supplied by the top and bottom contacts 510 and 511. The current pumping is significantly larger than the threshold for lasing so that a significant internal field exists in the lasing cavity. The amplified signal is input along axis 509 and through the angled facet 507, which is anti-reflection coated. The signal is propagated along the waveguide established by the graded index region 502 and the cladding regions 505 and 506. The signal acquires gain due to the gain medium 501. The lasing field pins the gain of the gain medium and crosstalk in the time domain and frequency domains is significantly reduced. If the distance between the mirrors (including their penetration distances) is significantly less than the dominant electron scattering time (10 fs) multiplied by the speed of light in the medium ($10^{10}$ cm/s), then due to the MNR effects, the noise along the amplifying axis 509 can be reduced. The noise is also reduced by the action of the distributed spatial filter arrangement described above. Diffraction region 512 has a graded index slab waveguide for optical confinement in the vertical direction, but no lateral confinement regions in the horizontal direction. The diffraction region has no gain medium. This type of amplifier can presently be fabricated to operate at wavelengths from 0.78 to almost 1.0 micron. CW lasing action with a surface emitting device cannot presently be achieved with a direct current at the wavelengths of 1.3–1.5 $\mu$m.

Figure 6:
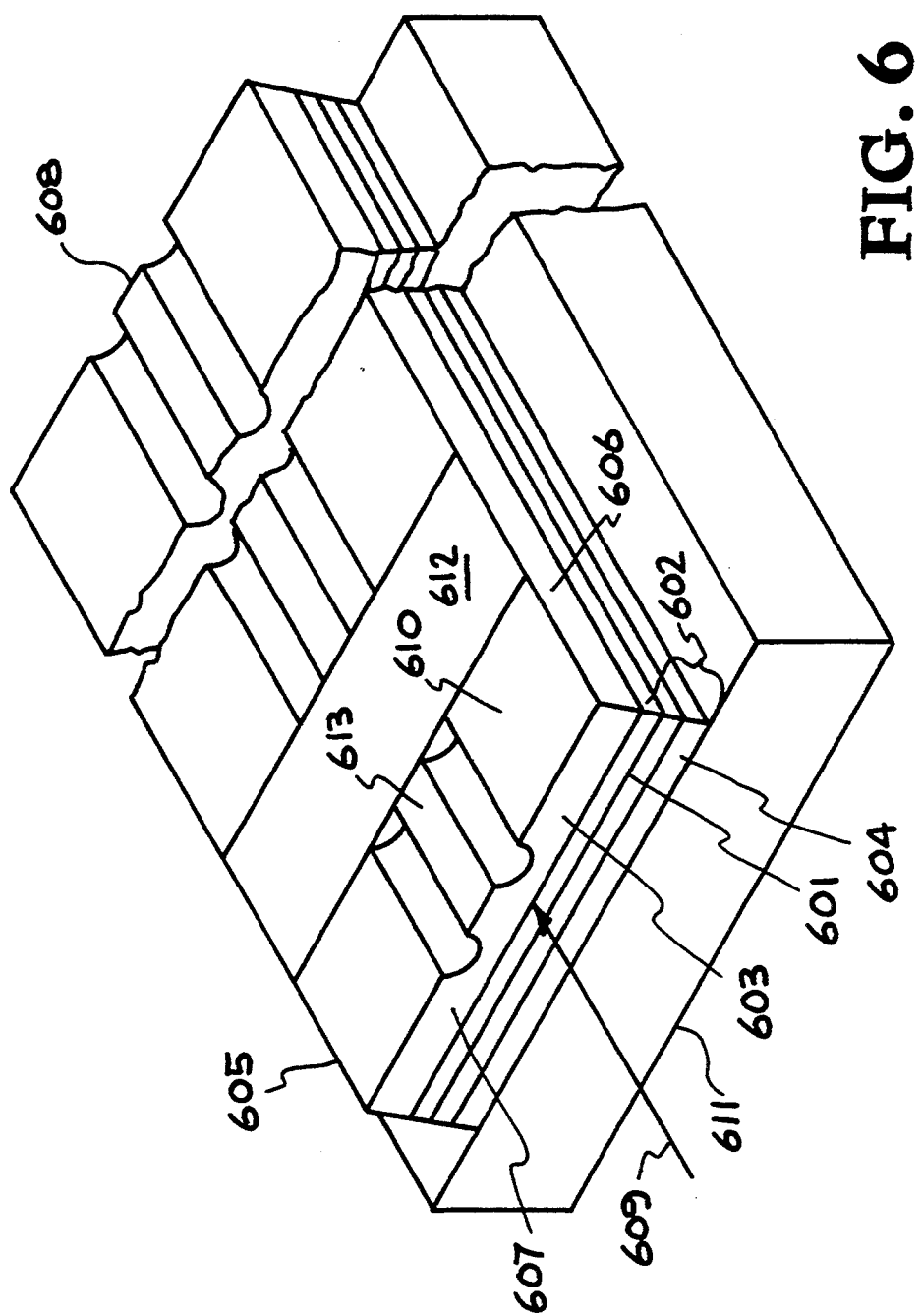
FIG. 6 shows a transverse lasing ballasting semiconductor optical amplifier.

Another embodiment for a ballasting SOA is shown in FIG. 6. The mirrors 605 and 606 are composed of structures that take any of the forms shown in FIGS. 2A–2D. Thus, parasitic lasing modes will be suppressed. This type is herein after referred to as a "transverse lasing SOA" and consists of a gain medium 601, a graded index slab guide region 602, electrically conductive cladding regions 603 and 604, laser mirror facets 605 and 606, input and output angled facets 607 and 608 that are antireflection coated and windowed, the input signal axis 609, the ridge waveguide 613, and electrical contacts 610 and 611. As discussed in the general embodiment (FIG. 1A), the lasing field is established by mirrors 606 and 607, gain medium 601 and slab guide 602. The pump current is supplied by the top and bottom contacts 610 and 611. The current pumping is significantly larger than the threshold for lasing so that a significant internal field exists in the lasing cavity. The parasitic lasing modes are suppressed by the mirror structures 607 and 608 as described. The result is crosstalk-free and high gain for the amplified signal. The amplified signal is input along axis 609 and through the input facet 607. The signal is propagated along the waveguide established by the ridge waveguide 613. The signal acquires gain due to the pumped gain medium 601. The lasing field pins the gain of the gain medium and crosstalk in the time and frequency domain is significantly reduced. The noise is reduced by the action of the distributed spatial filter arrangement described above. Diffraction region 612 has a slab waveguide but no ridge waveguide and no gain medium. This type of amplifier can, with present technology, be fabricated and made to operate in the 1.3–1.5 $\mu$m wavelength range as well as the wavelength 0.78–1.0 $\mu$m region.

Figure 7:
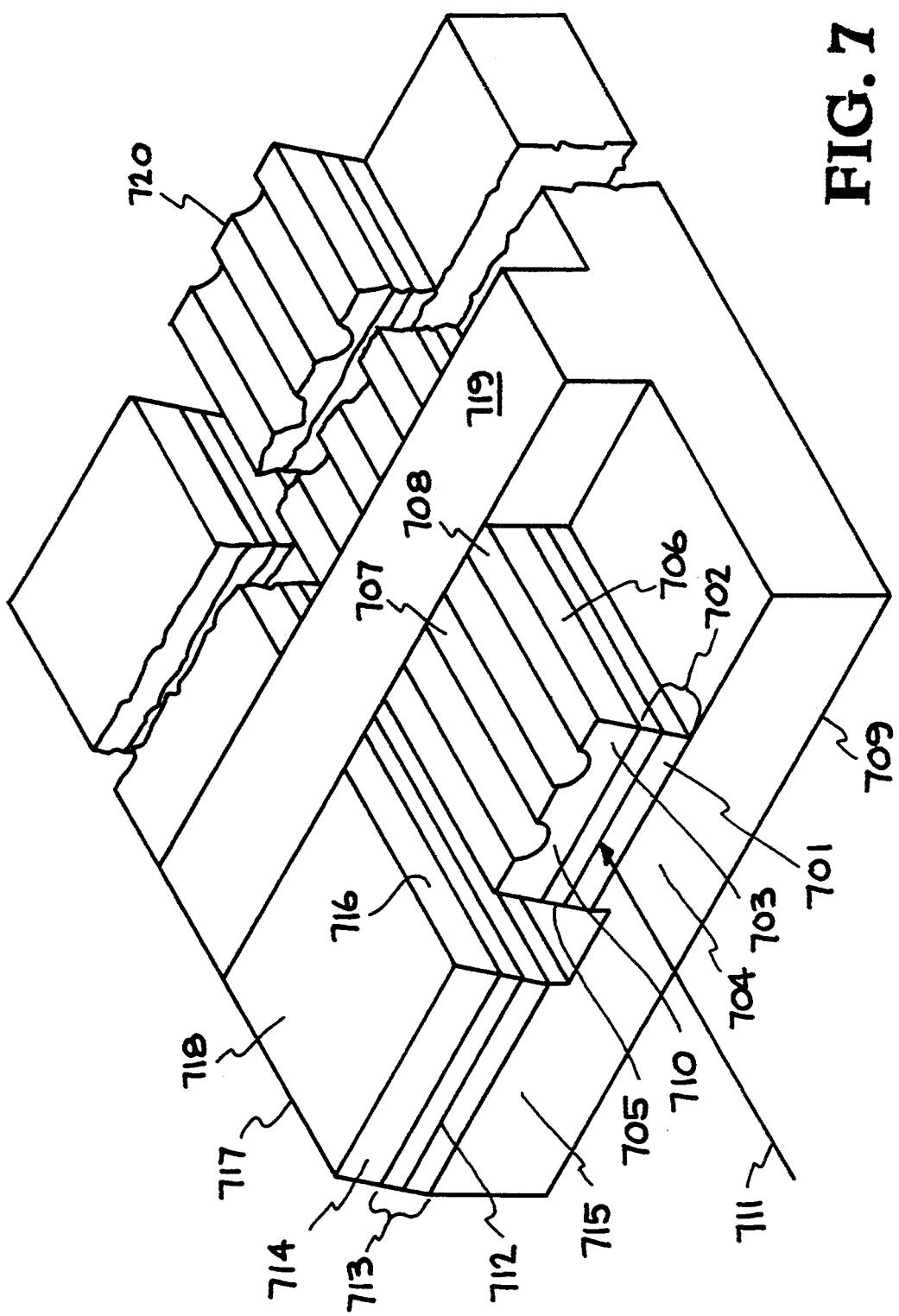
FIG. 7 shows a plenum-injected semiconductor optical amplifier.

A semiconductor system plenum-injection optical amplifier is shown in FIG. 7, hereinafter referred to as a plenum-injection SOA. The mirrors 705, 706, 716, and 717 are composed of structures that take the forms shown in FIG. 2A and 2C. Thus, parasitic lasing modes will be suppressed. The plenum-injection SOA consists of a gain medium 701, a graded index slab guide region 702, electrically conductive cladding regions 703 and 704, resonant cavity facets 705 and 706, input and ouput angled facets 710 and 720 that are antireflection coated and windowed, input signal axis 711, ridge waveguide 707, and electrical contacts 708 and 709. The laser cavity used to inject light consists of gain medium 712, a graded index slab guide region 713, electrically conductive cladding regions 714 and 715, and laser cavity facets 716 and 717. The electrical contacts are established by 718 and 709. As discussed in the general embodiment, the lasing field is established by mirrors 716 and 717, gain medium 712 and slab guide 713. The pump current is supplied by the top and bottom contacts 718 and 709. The current pumping is significantly greater than the threshold for lasing so that an intense light beam is output from laser facet 716 and injected through facet 705, slab waveguide 702, and gain medium 701. The amplified signal is input along axis 711 and through the input facet 710 and the output of the amplified signal is through facet 720. The signal is propagated along the waveguide established by the ridge waveguide 707. The signal acquires gain due to gain medium 701. The cavity established by facets 705 and 706, and slab waveguide 702, is used to resonantly enhance the light field about the gain medium 701. The length of this cavity and the mirror reflectivities are such that lasing in this cavity is not attained. Cavity gain can be modulated with pump current supplied through contact 708. The amplitude of the amplified light can be modulated at high speeds due to the injection of a high intensity light field from the laser established by mirrors 716 and 717. The noise is reduced by the DSF using diffraction region 719 and a repetition of the structure just described. This plenum-injection SOA can be used as part of a high speed laser with direct modulation and low noise with reduced turn-on time. Facets 710 and 720 would be made laser facets.

Changes and modifications in the specifically described embodiments can be carried out without departing from the scope of the invention, which is intended to be limited by the scope of the appended claims.

We claim:

1. An optical amplifier comprising:
    a gain medium having input and output facets, wherein an optical axis and an amplifying path are defined between said input and output facets;
    means for preventing reflections from said input and output facets;
    at least one pair of laser mirrors forming an off-axis laser cavity that encompasses said gain medium, wherein said laser cavity is off-axis with respect to said optical axis;
    means for suppressing off axis parasitic lasing modes within said gain medium;
    means for energizing said gain medium to cause stimulated emission between said at least one pair of laser mirrors; and
    means for introducing an optical signal on said optical axis, wherein said optical signal is amplified by said gain medium.

2. The optical amplifier of claim 1, wherein said means for suppressing parasitic lasing modes comprises optically opaque regions dispersed along and segmenting said amplifying path.

3. The optical amplifier of claim 1, wherein said means for suppressing parasitic lasing modes is comprised of a series of pairs of laser mirrors that are separated by optically reflective surfaces that deflect light out of the plane of lasing defined by an adjacent pair of laser mirrors.

4. The optical amplifier of claim 1, wherein said means for suppressing parasitic lasing modes comprises a series of pairs of corner reflectors that use total internal reflection to create off-axis lasing modes, wherein said reflectors of any given pair suppresses coupling between adjacent pairs.

5. The optical amplifier of claim 1, wherein said means of suppressing parasitic lasing modes comprises:
a series of pairs of laser mirrors that form cavities at an oblique angle with respect to said axis of said amplified signal;
wherein said cavities are staggered to result in parasitic lasing paths to be deflected away from said optical axis;
wherein said mirrors of any given pair suppress coupling between adjacent pairs;
wherein said cavities comprise an aperture to further suppress parasitic lasing paths.

6. The optical amplifier of claim 1, wherein said means for suppressing parasitic lasing modes comprises:
at least one pair of corner reflectors that use total internal reflection to create off-axis lasing modes, wherein said at least one pair of corner reflectors form at least one laser cavity at an oblique angle with respect to said optical axis; wherein said at least one laser cavity is staggered with respect to an adjacent laser cavity to deflect parasitic lasing paths away from said optical axis;
wherein said at least one pair of corner reflectors suppresses coupling between adjacent pairs.

7. The optical amplifier of claim 1, wherein said gain medium further comprises a means of guiding said optical signal, wherein said guiding means are selected from a group consisting of index guided structures, gain guided structures, tapered designs, gratings, evanesent wave couplers and optical fibers.

8. The optical amplifier of claim 1, wherein said gain medium is homogeneously broadened and is selected from a group consisting of semiconductor material, injection pumped gain media, titanium doped sapphire, erbium doped host material, Nd YAG and chemical dyes.

9. The optical amplifier of claim 1, wherein said gain medium consists of an inhomogeneous gain medium with a strong lasing field present such that the resulting power broadened homogeneous spectral linewidth exceeds the inhomogeneous spectral linewidth, wherein said inhomogenous material is selected from a group consisting of Nd-glass and cooled erbium-doped glass.

10. The optical amplifier of claim 1, wherein said energizing means are selected from a group consisting of electrical, optical, chemical, electrical injection and electron beam.

11. The optical amplifier of claim 1, wherein said at least one pair of mirrors is selected from a group consisting of dielectrics, semiconductor interfaces, metals, and distributed Bragg reflectors.

12. The optical amplifier of claim 1, wherein one mirror of said at least one pair of laser mirrors is partially transmissive to transmit a beam of laser light;
said optical amplifier further comprising:
a second gain medium comprising input and output facets defining a second optical axis, wherein said beam of light is incident on said second gain medium at an angle that is off-axis with respect to said second optical axis; and
means to introduce light into said second gain medium on said second optical axis.

13. The optical amplifier of claim 1, wherein said pair of off-axis mirrors are spaced apart a distance that is less than the coherence time of said gain medium multiplied by the speed of light in said gain medium, thus forming a microcavity.

14. The optical amplifier of claim 1, further comprising a series of optical amplifiers, wherein each amplifier of said series is separated from an adjacent optical amplifier by a diffraction region.

15. The optical amplifier of claim 1, comprising a surface emitting ballasting semiconductor optical amplifier (SOA),
wherein said gain medium comprises an injection pumped semiconductor active region having a first and second interface;
said optical amplifier further comprising:
an index slab guide region comprising:
a first index slab region fixedly connected to said first interface of said gain medium; and
a second index slab region fixedly connected to said second interface of said gain medium;
a first passivating and electrically insulated cladding region fixedly connected to a first lateral interface of said gain medium; and
a second passivating and electrically insulated cladding region fixedly connected to a second lateral interface of said gain medium;
wherein said reflection preventing means are on said input and output facets, wherein said reflection preventing means are selected from a group consisting of angled interfaces, antireflection coatings and optically transparent window sections;
wherein said at least one pair of mirrors comprise:
a first distributed Bragg reflector fixedly connected to said first graded index slab region; and
a second distributed Bragg reflector fixedly connected to said second graded index slab region;
wherein the reflectivity of said distributed Bragg reflector is designed to decrease rapidly as a function of the angle from the normal; and
wherein said energizing means comprise:
a first electrical contact bonded to said first distributed Bragg reflector; and
a second electrical contact bonded to said second distributed Bragg reflector;
and wherein said first and second distributed Bragg reflector are electrically conductive.

16. The optical amplifier of claim 1, comprising a surface emitting ballasting semiconductor optical amplifier:
wherein said gain medium comprises an active region;
wherein said optical amplifier further comprises:
upper and lower cladding layers fixedly connected to opposite sides of said gain :medium; and
cladding layers on lateral sides of said upper and lower cladding layers;
wherein said at least one pair of laser mirrors comprises a pair of distributed Bragg reflectors fixedly connected to said upper and lower cladding layers, wherein the reflectivity of said distributed Bragg reflector is designed to decrease rapidly as a function of the angle from the normal;
wherein said reflection preventing means at said input and output facets are selected from a group consisting of angled facets, antireflection coatings and nonabsorbing window regions; and
wherein said energizing means comprises contacts made to the active region such that a semiconductor diode is formed.

17. The optical amplifier of claim 15, wherein the distance between said first distributed. Bragg reflector and said second distributed Bragg reflector, including their penetration distances, is less than the dominant electron scattering time of said gain medium multiplied by the speed of light in said gain medium.

18. The optical amplifier of claim 15, further comprising a series of surface emitting ballasting semiconductor optical amplifiers, wherein a diffraction region is between each surface emitting ballasting SOA, thus serving a segmenting and spatial filtering function, wherein said series of said optical amplifiers and said diffraction regions cause the gain of the amplified spontaneous emission to be significantly less than the gain of the amplified signal.

19. The optical amplifier of claim 1, comprising a semiconductor optical amplifier,
   wherein said gain medium comprises a first and second interface;
   said optical amplifier further comprising a graded index slab guide region comprising:
      a first graded index slab region fixedly connected to said first interface of said gain medium; and
      a second graded index slab region bonded to said second interface of said gain medium;
   wherein said preventing means comprise an angle and anti-reflection coating formed on said input and output facets and on said graded index slab guide region;
   wherein a first mirror of said pair of mirrors is a first laser mirror formed on a first lateral interface of said gain medium and said graded index slab guide region;
   wherein a second mirror of said pair of mirrors is a second laser mirror formed on a second lateral interface of said gain medium and said graded index slab guide region; and
   wherein said energizing means comprises:
      a first electrically conductive cladding region bonded to said first graded index slab region;
      a second electrically conductive cladding region bonded to said second graded index slab region;
      a first electrical contact bonded to said first electrically conductive cladding region; and
      a second electrical contact bonded to said second electrically conductive cladding region;
   and further comprising a ridge waveguide formed in said first electrically conductive cladding region.

20. The optical amplifier of claim 1, comprising a transverse lasing semiconductor optical amplifier,
   wherein said gain medium comprises an active region;
   wherein said optical amplifier further comprises:
      upper and lower cladding layers fixedly connected to opposite sides of said gain medium; and
      lateral cladding layers on both lateral sides of said upper and lower cladding layers;
   wherein said pair of laser mirrors are selected from a group consisting of
      a series of pairs of laser mirrors that are separated by optically reflective surfaces that deflect light out of a plane of lasing defined by an adjacent pair of laser mirrors,
      a series of pairs of corner reflectors that use total internal reflection to create off-axis lasing modes,
      a series of pairs of laser mirrors that form cavities at an oblique angle with respect to said axis of said amplified signal, wherein said cavities are staggered to result in parasitic lasing paths to be deflected away from said optical axis, wherein said reflectors of any given pair suppress coupling between adjacent pairs, wherein said cavities comprise an aperture to further suppress parasitic lasing paths and
      at least one pair of corner reflectors that use total internal reflection to create off-axis lasing modes, wherein said at least one pair of corner reflectors form at least one laser cavity at an oblique angle with respect to said optical axis; wherein said at least one laser cavity is staggered with respect to an adjacent laser cavity to deflect parasitic lasing paths away from said optical axis, wherein said at least one pair of corner reflectors suppresses coupling between adjacent pairs;
   wherein said reflection preventing means at said input and output facets is selected from a group consisting of angled facets, antireflection coatings and nonabsorbing window regions; and
   wherein said energizing means consists of electrical contacts made to said active region such that a semiconductor diode is formed.

21. The optical amplifier of claim 19, further comprising a series of transverse lasing semiconductor optical amplifiers, wherein a diffraction region comprised of a slab waveguide is fixedly connected between each amplifier of said series of amplifiers, and wherein said series of optical amplifiers and said diffraction regions cause the gain of the amplified spontaneous emission to be significantly less than the gain of the amplified signal.

22. The optical amplifier of claim 12, comprising a plenum-injection semiconductor optical amplifier,
   wherein said gain medium comprises a first and second interface;
   said optical amplifier further comprising a graded index slab guide region comprising:
      a first graded index slab region bonded to said first interface of said gain medium; and
      a second graded index slab region bonded to said second interface of said gain medium;
   wherein said preventing means comprise an angle and anti-reflection coating formed on said input and output facets and on said graded index slab guide region;
   wherein a first mirror of said pair of mirrors is a first laser mirror formed on a first lateral interface of said gain medium and said graded index slab guide region;
   wherein a second mirror of said pair of mirrors is a second laser mirror formed on a second lateral interface of said gain medium and said graded index slab guide region; and
   wherein said energizing means comprises:
      a first electrically conductive cladding region fixedly connected to said first graded index slab region;
      a second electrically conductive cladding region fixedly connected to said second graded index slab region;
      a first electrical contact fixedly connected to said first electrically conductive cladding region; and
      a second electrical contact fixedly connected to said second electrically conductive cladding region; and
   further comprising a ridge waveguide formed in said first electrically conductive cladding region;
   further comprising means to reduce the response time of said gain medium, said reducing means comprising:

a gain medium comprising a second gain medium having a first and second interface;

a second optical amplifier comprising a second graded index slab guide region comprising:

a third graded index slab region fixedly connected to said first interface of said second gain medium; and a fourth graded index slab region fixedly connected to said second interface of said second gain medium;

a second preventing means comprising a second angle and anti-reflection coating formed on said input and output facets and on said second graded index slab guide region;

a second pair of mirrors comprising:

a third laser mirror formed on a third lateral interface of said second gain medium and said second graded index slab guide region; and a fourth laser mirror formed on a fourth lateral interface of said second gain medium and said second graded index slab guide region; and a second energizing means comprising:

a third electrically conductive cladding region fixedly connected to said third graded index slab region;

a fourth electrically conductive cladding region fixedly connected to said fourth graded index slab region; and a third electrical contact fixedly connected to said third electrically conductive cladding region; and wherein said second electrical contact is fixedly connected to said fourth electrically conductive cladding region.

23. The optical amplifier of claim 12, comprising a plenum-injection semiconductor optical amplifier, wherein said gain medium comprises an active region;

wherein said optical amplifier further comprises:
upper and lower cladding layers fixedly connected to opposite sides of said gain medium; and
lateral cladding layers on both lateral sides of said upper and lower cladding layers;

wherein said pair of laser mirrors are selected from a group consisting of a series of pairs of laser mirrors that are separated by optically reflective surfaces that deflect light out of the plane of lasing defined by an adjacent pair of laser mirrors, and a series of pairs of laser mirrors that form cavities at an oblique angle with respect to said axis of said amplified signal, wherein said cavities are staggered to result in parasitic lasing paths to be deflected away from said optical axis, wherein said reflectors of any given pair suppress coupling between adjacent pairs, wherein said cavities comprise an aperture to further suppress parasitic lasing paths;

wherein said reflection preventing means at said input and output facets are selected from a group consisting of angled facets, antireflection coatings and nonabsorbing window regions;

wherein said energizing means comprises electrical contacts made to said active region;

wherein said energizing means are operated below threshold of said active region;

wherein said second gain medium comprises an active region, upper and lower cladding layers and a second pair of laser mirrors;

wherein said second pair of laser mirrors is selected from a group consisting of a series of pairs of laser mirrors that are separated by optically reflective surfaces that deflect light out of the plane of lasing defined by an adjacent pair of laser mirrors, and a series of pairs of laser mirrors that form cavities at an oblique angle with respect to said axis of said amplified signal, wherein said cavities are staggered to result in parasitic lasing paths to be deflected away from said optical axis, wherein said reflectors of any given pair suppress coupling between adjacent pairs, wherein said cavities comprise an aperture to further suppress parasitic lasing paths; and further comprising contacts made to the second active region such that a second semiconductor diode is formed to allow said second gain medium to operate above laser threshold.

24. The optical amplifier of claim 22, further comprising a series of plenum-injection semiconductor optical amplifiers, wherein a diffraction region comprised of a slab waveguide is fixedly connected between each amplifier of said series of amplifiers; and wherein said series of said optical amplifiers and said diffraction regions cause the gain of the amplified spontaneous emission to be significantly less than the gain of the amplified signal.

* * * * *